United States Patent
Baek et al.

(10) Patent No.: US 9,316,699 B2
(45) Date of Patent: Apr. 19, 2016

(54) SYSTEM FOR PREDICTING LIFETIME OF BATTERY

(75) Inventors: HoYul Baek, Yongin-si (KR); Jeongsoon Shin, Yongin-si (KR); Cheol Ho Park, Yongin-si (KR); Heekwan Chai, Yongin-si (KR); Younghwa Ko, Yongin-si (KR); Seung Bum Suh, Yongin-si (KR); Kyeong-Beom Cheong, Yongin-si (KR); Nokap Park, Yongin-si (KR)

(73) Assignee: SAMSUNG SDI CO., LTD., Yongin-si, Gyeonggi-do (KR)

(*) Notice: Subject to any disclaimer, the term of this patent is extended or adjusted under 35 U.S.C. 154(b) by 728 days.

(21) Appl. No.: 13/532,148

(22) Filed: Jun. 25, 2012

(65) Prior Publication Data

US 2013/0268466 A1    Oct. 10, 2013

Related U.S. Application Data

(60) Provisional application No. 61/620,562, filed on Apr. 5, 2012.

(51) Int. Cl.
| | |
|---|---|
| *G06F 15/18* | (2006.01) |
| *G01R 31/36* | (2006.01) |
| *H01M 10/48* | (2006.01) |
| *G06N 5/00* | (2006.01) |

(52) U.S. Cl.
CPC ........... *G01R 31/3679* (2013.01); *H01M 10/48* (2013.01); *G01R 31/3651* (2013.01); *G06N 5/00* (2013.01)

(58) Field of Classification Search
None
See application file for complete search history.

(56) References Cited

U.S. PATENT DOCUMENTS

| | | |
|---|---|---|
| 2001/0022509 A1 | 9/2001 | Schulmayr et al. |
| 2005/0194936 A1 | 9/2005 | Cho |
| 2010/0312733 A1 | 12/2010 | Song et al. |

(Continued)

FOREIGN PATENT DOCUMENTS

| | | |
|---|---|---|
| KR | 10-2004-0051195 A | 6/2004 |
| KR | 10-2005-0061386 | 6/2005 |

(Continued)

OTHER PUBLICATIONS

Charlton, J. Amer. Soc. Naval Eng., vol. XXXII, No. 4, pp. 613-651, 1920.*

(Continued)

*Primary Examiner* — Kakali Chaki
*Assistant Examiner* — Michael Zidanic
(74) *Attorney, Agent, or Firm* — Lee & Morse, P.C.

(57) ABSTRACT

A system for predicting a lifetime of a battery cell, including a learning data input unit, the learning data input unit being configured to receive at least one learning measurement factor and at least one learning factor, a target data input unit, the target data input unit being configured to receive at least one target factor, a machine learning unit, the machine learning unit being coupled to the learning data input unit, the machine learning unit assigning weights to respective ones of the learning factors input to the learning data input unit, and a lifetime prediction unit, the lifetime prediction unit being coupled to the target data input unit and the machine learning unit, the lifetime prediction unit using the weights assigned by the machine learning unit to predict one or more characteristics indicative of the lifetime of the target battery cell.

19 Claims, 5 Drawing Sheets

(56) References Cited

U.S. PATENT DOCUMENTS

2011/0202159 A1    8/2011  Wang et al.
2011/0236751 A1*   9/2011  Amiruddin et al. ........... 429/188

FOREIGN PATENT DOCUMENTS

KR    2009-0020448 A    2/2009
WO    WO 2007/027702 A2  3/2007

OTHER PUBLICATIONS

European Search Report in EP 12176616.6-1359, dated Jul. 4, 2013 (Baek, et al.).
Alpaydin, "Introduction to Machine Learning," 2010; pp. 1-539; Second Edition; MIT Press; Cambridge, Massachusetts; USA.
Park, et al.; "Pattern Recognition and Machine Learning,—Abstract" Mar. 5, 2011 Ehan Publishing Company.
European Office Action dated Feb. 2, 2016.

* cited by examiner

SYSTEM FOR PREDICTING LIFETIME OF BATTERY

CROSS-REFERENCE TO RELATED APPLICATION

The present application claims priority under 35 U.S.C. §119(e) to U.S. Provisional Application No. 61/620,562, filed on Apr. 5, 2012, and entitled: "System for Predicting Lifetime of Battery," which is incorporated herein by reference in its entirety.

BACKGROUND

1. Field

Embodiments relate to a system for predicting lifetime of a battery.

2. Description of the Related Art

Devices may be manufactured to particular specifications so as to provide a desired set of performance characteristics. For some devices, a characteristic of interest may be device lifetime. Lifetime is often tested by accelerated testing methods. Generally, battery lifetime may be estimated based on testing done on representative samples of a lot of manufactured batteries. Such tests may vary in accuracy and may take significant amounts of time to complete.

SUMMARY

Embodiments are directed to a system for predicting a lifetime of a battery cell, the system including a learning data input unit, the learning data input unit being configured to receive at least one learning measurement factor and at least one learning factor, the learning measurement factor and the learning factor corresponding to a learning battery cell that was previously-manufactured, a target data input unit, the target data input unit being configured to receive at least one target factor, the target factor corresponding a target battery cell for which a lifetime is to be predicted, a machine learning unit, the machine learning unit being coupled to the learning data input unit, the machine learning unit assigning weights to respective ones of the learning factors input to the learning data input unit, and a lifetime prediction unit, the lifetime prediction unit being coupled to the target data input unit and the machine learning unit, the lifetime prediction unit using the weights assigned by the machine learning unit to predict one or more characteristics indicative of the lifetime of the target battery cell.

The learning measurement factor may be obtained by actual measurement of a characteristic value of the learning battery cell.

The learning measurement factor may be selected from the group of a change in a capacity of the learning battery cell depending on a number of cycles and a change in a thickness of the learning battery cell depending on a number of cycles.

One cycle may consist of one charge, one discharge, and one idle time, the idle time being a time between the charge and the discharge or a time between the charge and/or discharge and a next charge and/or discharge.

The at least one learning factor may be selected from the group of a learning design factor, a learning process factor, and a learning formation factor.

The learning data input unit may be configured to receive at least one learning design factor, the learning design factor being indicative of a design parameter of the learning battery cell.

The learning design factor may be selected from the group of a capacity of the learning battery cell, an energy density of the learning battery cell, a thickness of the learning battery cell, a length of the learning battery cell, a width of the learning battery cell, a current density of the learning battery cell, a slurry concentration of the learning battery cell, an electrode thickness of the learning battery cell, a loading level of the learning battery cell, a form factor of the learning battery cell, a width of a separator of the learning battery cell, a thickness of the separator of the learning battery cell, a kind of the separator of the learning battery cell, a presence or absence of separator coating on the separator of the learning battery cell, a number of windings of an electrode plate of the learning battery cell, a number of windings of the separator of the learning battery cell, an adhesion between an electrode plate and the separator of the learning battery cell, a type of electrolyte used, an electrolyte composition of the learning battery cell, an electrolyte amount of the learning battery cell, a kind of additive of the learning battery cell, an amount of additive of the learning battery cell, a discharge rate (C-rate) of the learning battery cell, a porosity of the learning battery cell, a thickness of a current collector of the learning battery cell, a strength of the current collector of the learning battery cell, a thickness of a pouch of the learning battery cell, a physical property value of an active material of the learning battery cell, and a physical property value of a binder material of the learning battery cell.

The learning design factor may be known prior to manufacture of the learning battery cell.

The learning data input unit may be configured to receive at least one learning process factor, the learning process factor being indicative of a process parameter used during manufacture of the learning battery cell.

The learning process factor may be selected from the group of a winding tension of a component of the learning battery cell, a degassing and folding condition of the learning battery cell, and a tab welding method of the learning battery cell, the component being a separator or an electrode plate.

The learning data input unit may be configured to receive at least one learning formation factor, the learning formation factor being indicative of a formation parameter of the learning battery cell following the assembly of the learning battery cell.

The learning formation factor may be selected from the group of a temperature, a time, a charge and/or discharge current, a voltage, a cutoff condition, and a pressure associated with one or more selected from the group of aging, charging and/or discharging, and degassing and resealing the learning battery cell.

The at least one target factor may be selected from the group of a target design factor, a target process factor, and a target formation factor.

The lifetime prediction unit may be configured to predict a characteristic selected from the group of a change in a capacity of the target battery cell depending on a number of cycles and a change in a thickness of the target battery cell depending on a number of cycles.

The machine learning unit may include a number of machine learning subunits, and the lifetime prediction unit may include a number of lifetime prediction subunits corresponding to the number of machine learning subunits.

Each machine learning subunit may assign a weight based on a corresponding learning factor, the learning factor being selected from the group of a learning design factor, a learning process factor, and a learning formation factor.

Each lifetime prediction subunit may perform a prediction function using a weight assigned by a corresponding machine learning subunit.

The system may further include a lifetime indication unit, the lifetime indication unit being coupled to the lifetime prediction unit, the lifetime indication unit indicating a predicted lifetime of the target battery cell based on the one or more predicted characteristics.

Embodiments are directed to a method of predicting a lifetime of a target battery cell, the method including establishing a prediction function, establishing the prediction function including receiving a first factor of a previously-manufactured learning battery cell and receiving a second factor of the learning battery cell, the first factor being determined from an historical measurement of a characteristic of the learning battery cell, the second factor corresponding to the manufacture of the learning battery cell and being selected from the group of a design factor of the learning battery cell, a process factor of the learning battery cell, and a formation factor of the learning battery cell, and correlating the first factor of the learning battery cell with the second factor of the learning battery cell, receiving a second factor of the target battery cell as an input, the second factor of the target battery cell being selected from the group of a design factor of the target battery cell, a process factor of the target battery cell, and a formation factor of the target battery cell, applying the prediction function to the second factor of the target battery cell, and based on the application of the prediction function to the second factor of the target battery cell, outputting a predicted characteristic of the target battery cell.

BRIEF DESCRIPTION OF THE DRAWINGS

Features will become apparent to those of skill in the art by describing in detail example embodiments with reference to the attached drawings in which.

DETAILED DESCRIPTION

Figure 1:
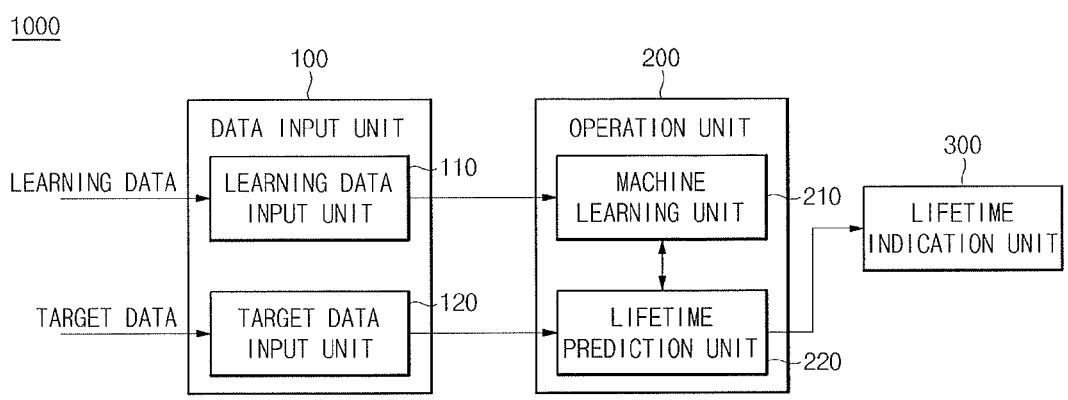
FIG. 1 illustrates a schematic block diagram of a configuration of a battery lifetime prediction system according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

DESCRIPTION OF THE SYMBOLS IN THE DRAWINGS

1000: Battery lifetime prediction system
100: Data input unit
110: Learning data input unit
120: Target data input unit
200: Operation unit
210: Machine learning unit
220: Lifetime prediction unit
300: Lifetime indication unit FIG. 1 illustrates a schematic block diagram of a configuration of a battery lifetime prediction system according to an embodiment.

Referring to FIG. 1, the battery lifetime prediction system 1000 according to an embodiment includes a data input unit 100, an operation unit 200, and a lifetime indication unit 300.

The data input unit 100 is an interface that receives various types of data required for learning operations and lifetime prediction operations of the operation unit 200. The data input unit 100 may include a learning data input unit 110 for receiving learning data (i.e., for receiving data to be learned). The learning data input unit 110 may be coupled to a machine learning unit 210 in the operation unit 200.

The data input unit 100 may also include a target data input unit 120 for receiving target data (i.e., for receiving data for a prediction battery cell (a battery cell targeted for lifetime prediction)). The data input unit 100 may be coupled to a lifetime predication unit 220 in the operation unit 200.

As described in detail below, the machine learning unit 210 may assign weights to respective factors, and the lifetime prediction unit 220 may predict a lifetime of the battery using the weights.

The learning data input unit 110 may receive, as its inputs, data to be learned (referred to herein as learning data) of a battery cell targeted for learning (to be referred to as learning target cell, hereinafter). In more detail, the learning data input unit 110 may receive the learning data by designating a medium file on a computer, recorded according to predefined regulations, or offering user interface including a standardized template for direct entry of the learning data. The learning data may mean determinant factors of a lifetime of a battery cell and may be used for learning of the machine learning unit 210.

Learning Data

As shown in Table 1, the learning data may include measurement factors by cycle and other factors such as design factors, process factors, and formation factors (each of which is described in detail below) for learning target cells. The learning data may be numerically represented.

As described below, the measurement factor by cycle is indicative of the lifetime of the learning target cell. The measurement factor by cycle may be input and used for learning correlation between: (a) the other factors (i.e., one or more design factors, one or more process factors, and/or one or more formation factors), and (b) the battery cell lifetime.

TABLE 1

| | Design factor | Process factor | Formation factor | Measurement factor By Cycle |
|---|---|---|---|---|
| Cell 1 | | | | |
| Cell 2 | | | | |
| Cell 3 | | | | |
| . | | | | |
| . | | | | |
| . | | | | |
| Cell n | | | | |

Learning Data

Design Factors

The design factors may be numerical values used for manufacturing a battery. In the present example embodiment, the design factors are predetermined factors that are known before manufacturing the battery cell. The design factors are factors associated with design elements constituting a learning target cell and may include the capacity, energy density, thickness, length, width, current density, slurry density, electrode thickness, loading level, and form factor of a learning target cell, the width, thickness and kind of a separator, presence or absence of separator coating, the winding numbers of electrode plates and separator, adhesion between electrode plate and separator, type of electrolyte used, electrolyte composition, electrolyte amount, the kind and content of additive, discharge rate (C-rate), porosity, the thickness and strength of base panel, the thickness of pouch, physical property values of active material, physical property values of binder material, and so on.

The current density of cell may mean a density of flow of current per unit area of the battery cell, which is represented in unit of milliamperes per square centimeter (mA/cm$^2$). The slurry density of cell may mean a mass of a positive or negative electrode material of cell per unit volume in cubic centimeter (cc), which is represented in unit of grams per (g/cc). The electrode plate may be formed by coating an active material on a current collector, and the thickness of electrode plate may mean the overall thickness of the current collector and the active material. The loading level may mean an amount of active material coated on the electrode plate per unit area, which is represented in unit of milligram per square centimeter (mg/cm$^2$). The form factor may mean a cell size, which is indicated by the product of cell thickness, width, and length. The coating of separator may include coating a separator surface for the purpose of improving thermal, electrical, and mechanical safety of the separator. The coating material may include non-woven fabric, an inorganic material (e.g., ceramic) and so on. The adhesion between electrode plate and separator may mean adhesion between a positive electrode plate or a negative electrode plate coated with an active material and a separator, specifically adhesion between the active material and the separator. The discharge rate (C-rate) may mean a capacity ratio of a discharge C-rate capacity under condition 1 to a discharge C-rate capacity under condition 2. Here, the condition 1 may mean a standard condition or client-requested evaluation condition, and the condition 2 may mean a condition that is higher or lower than the standard condition. The porosity may mean a ratio of pores or space in a cell to its total volume. The base panel may mean a current collector and the thickness of base panel may mean a thickness of the current collector. The physical property values of the active material and binder material may mean electric conductivity, ionic conductivity, porosity, specific dielectric constant, diffusion coefficient, and crystal structure of material. The specific dielectric constant may mean a capacitance ratio of a dielectric material. The diffusion coefficient may mean a value for quantitatively indicating diffusivity of a material in a medium.

The present example embodiment does not limit the design factors to the factors described above and the design factors may include all design factors that may affect a lifetime of a battery. The design factors are not data obtained through measurement but are numerical values required for manufacturing a battery, which can be known before manufacturing the battery cell.

Process Factors

The process factors are associated with process conditions for assembling component of a learning target cell (e.g., a positive electrode plate, a negative electrode plate, a separator, etc.) and may include winding tension, D/F conditions, time, temperature, tab welding method, and so on. Here, the D/F conditions may mean conditions of temperature, pressure, and time in degassing (D) and folding (F) processes. The degassing process may be a process for removing the internal gas of a pouch and the folding process may be a process for folding a pouch.

The present example embodiment does not limit the process factors to the factors described above and the process factors may include all process factors that may affect a lifetime of a battery.

Formation Factors

The formation factors are factors associated with process conditions for making the assembled learning target cell usable before the battery cell is actually used, and may include temperature, time, charge and/or discharge current, voltage, cutoff condition, pressure, and so on, for aging, charging and/or discharging, degassing and resealing. The present example embodiment does not limit the formation factors and the formation factors may include all formation factors that may affect a lifetime of a battery.

Measurement Factors by Cycle

The measurement factor by cycle may be a to-be-predicted value representing a lifetime of a cell. In the present example embodiment, the measurement factors by cycle are numerical values obtained by measurements performed on an actual, previously-manufactured battery cell (or group thereof). Representative examples of the measurement factor by cycle may include changes in capacity and thickness of a learning target cell depending on the number of cycles (here, one cycle means one time charge and one time discharge, including an idle time between one time charge and one time discharge or between one time charge and/or discharge and next time charge and/or discharge).

Meanwhile, factors associated with evaluation conditions for obtaining the measurement factor by cycle value may include a thickness change of a learning target cell depending on the number of cycle, charge and/or discharge current, charge and/or discharge voltage, idle time, temperature, state of charging (SOC), SOC swing, capacity measurement interval, capacity evaluation method, learning target cell thickness measurement interval, thickness measurement method, and so on.

The SOC may mean a charged state of the battery cell. For example, assuming that the battery cell capacity is 1000 mAh, the capacity becomes a capacity for the voltage of a cell ranging from 3.2 V to 4.2 V. The SOC value for 3.2 V is 0% and the SOC value for 4.2 V is 100%. For example, when a cell is charged with SOC of 100%, the battery cell capacity is 1000 mAh. When a cell is charged with SOC of 50%, the battery cell capacity is 500 mAh, that is, half of 1000 mAh. The SOC swing may mean charging of cells with swinging SOC values.

The capacity measurement interval means the number of cycles between cell capacity measurements. The thickness measurement interval means the number of cycles between cell thickness measurements. The capacity evaluation method is an evaluation method of a specification capacity, including cell capacity measurement by continuous charging and discharging under the same charge and/or discharge conditions, and cell lifetime determination based on the capacity measured under one of different charge and/or discharge conditions.

The present example embodiment does not limit the measurement factors to the factors described above and the measurement factors may include all measurement factors that may affect a lifetime of a battery.

In the present example embodiment, it is most preferable to input all factors for the learning target cell to the learning data input unit 110, but it is not necessary. In the present example embodiment, the measurement factor by cycle is a factor indicating the lifetime of the learning target cell and is always used as an input factor for learning correlation between other factors and cell lifetime. Among the design factor, the process factor, and the formation factor, the design factor may be a factor mostly affecting the lifetime of battery cell. Therefore, an input set may consist of at least the design factor and the measurement factor by cycle as one piece of learning data to learning data input unit 110. Even if learning relative to the process factor or the formation factor is omitted, the learning result may not be considerably affected.

The target data input unit 120 may receive data for a battery cell targeted for lifetime prediction (referred to herein as target data). In more detail, the target data input unit 120 may receive the target data by designating a medium file on a computer, recorded according to predefined regulations, or offering user interface including a standardized template for direct entry of the target data. The target data may be used for the operation unit 200 to predict the lifetime of a battery cell.

Target Data

The target data may include the design factor, the process factor, and the formation factor for the battery cell targeted for lifetime prediction (to be referred to as a prediction target cell, hereinafter), which may be represented by numerical values. Here, the measurement factor-by-cycle as target data is not input to the target data input unit 120.

The design factors are factors associated with design elements constituting a learning target cell and may include the capacity, energy density, thickness, breadth, width, current density, slurry density, electrode thickness, loading level, and form factor of a learning target cell, the width, thickness and kind of a separator, presence or absence of separator coated, the winding numbers of electrode plates and separator, adhesion between electrode plate and separator, type of electrolyte used, electrolyte composition, electrolyte amount, the kind and content of additive, discharge rate (C-rate), porosity, the thickness and strength of base panel, the thickness of pouch, physical property values of active material, physical property values of binder material, and so on.

The present example embodiment does not limit the design factors to the factors described above and the design factors may include all design factors that may affect a lifetime of a battery. The design factors are not data obtained through measurement but are numerical values reflecting physical and/or chemical characteristics required for manufacturing a battery, which can be known before measuring data of the battery cell.

Therefore, unlike in a lifetime prediction in which a measurement time is required to obtain input values for predicting the lifetime, in the present example embodiment, additional measurement time is not required to obtain input values for predicting the lifetime time. In addition, in the present example embodiment, lifetime prediction is performed using the input values reflecting physical and/or chemical characteristics, thereby ensuring high reliability for predicted lifetime.

The process factors are associated with process conditions for assembling component of a learning target cell (e.g., a positive electrode plate, a negative electrode plate, a separator, etc.) and may include winding tension, D/F conditions, time, temperature, tab welding method, and so on. The present example embodiment does not limit the process factors to the factors described above and the process factors may include all process factors that may affect a lifetime of a battery.

The formation factors are factors associated with process conditions for making the assembled prediction target cell usable before the battery cell is actually used, and may include temperature, time, charge and/or discharge current, voltage, cutoff condition, pressure, and so on, for aging, charging and/or discharging, degassing, and resealing. The present example embodiment does not limit the formation factors and the formation factors may include all formation factors that may affect a lifetime of a battery.

In the present example embodiment, it is most preferable to input all factors for the prediction target cell to the learning data input unit 110, but it is not necessary to input all factors. For example, it is possible to perform lifetime prediction by inputting only the design factor to the target data input unit 120 as the target data. In addition, it is not necessary to select all factors included in the design factors as target data. It is also possible to select only some factors and input the selected factors to the target data input unit 120.

The operation unit 200 may include a machine learning unit 210 and a lifetime prediction unit 220.

Machine Learning Unit

The machine learning unit 210 may assign weights to the respective factors by performing machine learning on the factors input through the learning data input unit 110. For example, assuming that machine learning is performed on: (a) winding numbers of electrode plate and separator, and (b) cell capacity-by-cycle, i.e., using (a) and (b) as learning data, the machine learning unit 210 obtains a prediction function expressing correlation between the winding numbers and the battery cell capacity-by-cycle, and may assign weights to the factors of winding numbers according to how the winding numbers affect the battery cell capacity-by-cycle. Eventually, the machine learning unit 210 assigns weights indicating how much the design factors, the process factors, and the formation factors of an arbitrary battery cell affect cell capacity changes by cycle (i.e., how much the design factors, the process factors, and the formation factors of an arbitrary battery cell affect the lifetime of the battery cell), and performs an operation on the prediction function to learn the lifetime characteristic of the battery cell. The machine learning process may be performed using all learning data input to the learning data input unit 110 as the target data. The learning result may be stored in a separate storage medium (not shown).

Figure 2:
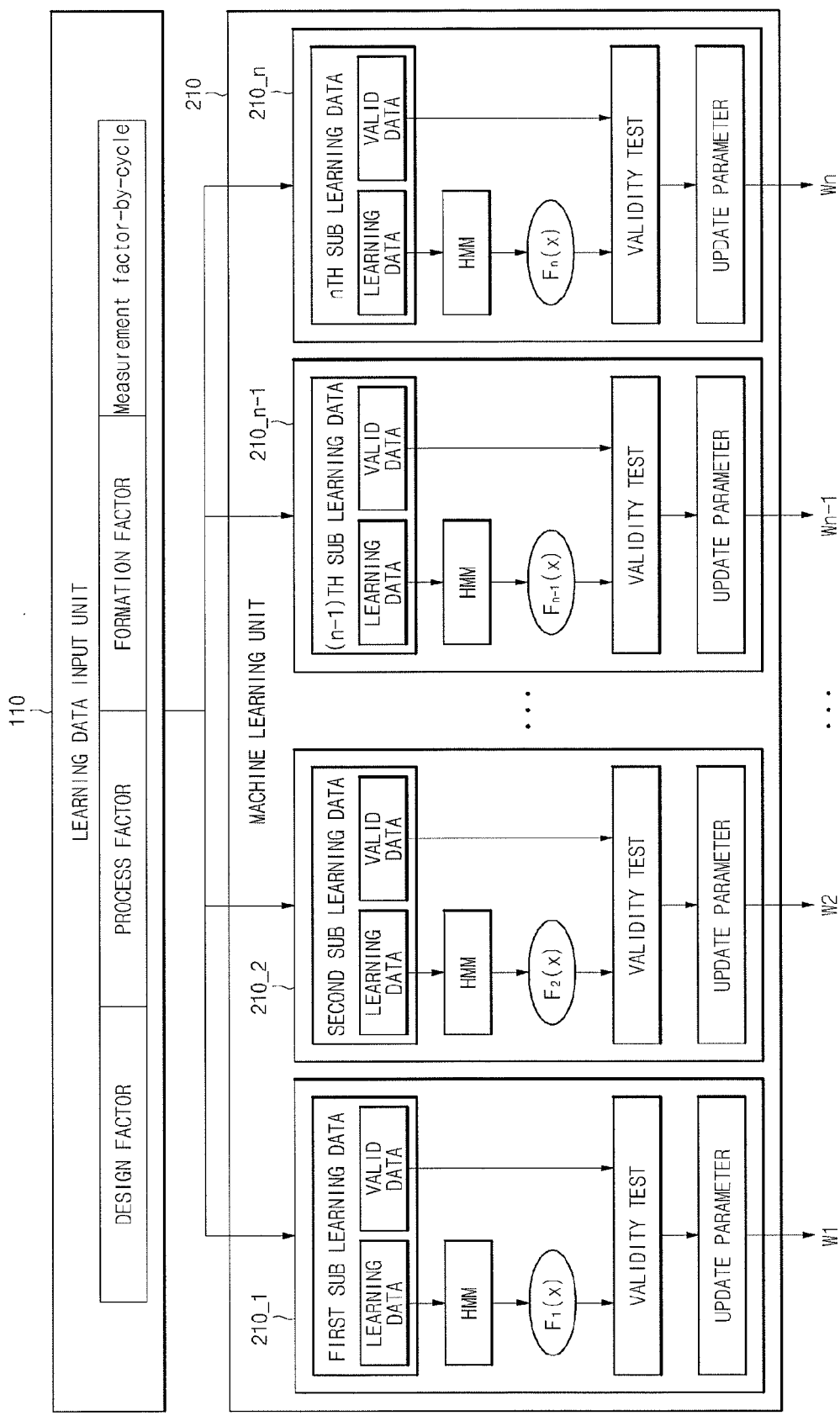
FIG. 2 illustrates a block diagram of details of a configuration of a machine learning unit shown in FIG. 1.

FIG. 2 illustrates a block diagram of details of a configuration of a machine learning unit shown in FIG. 1.

Referring to FIG. 2, the machine learning unit 210 may include a plurality of machine learning subunits 210_1, 210_2, . . . , 210_$n$–1, and 210_$n$. The same number of arbitrary data may be input to the plurality of machine learning subunits 210_1, 210_2, . . . , 210_$n$–1, and 210_$n$, respectively, irrespective of the factor group defined by the learning data input unit 110. In the present example embodiment, the measurement factor by cycle is always an input factor of a learning data set. For example, assuming that the number of learning data sets input to the machine learning subunits 210_1, 210_2, . . . , 210_n−1, and 210_n is 25, 20 first learning data sets and 5 second learning data sets may be input to the first machine learning subunit 210_1. Here, the first learning data sets basically include design factors and measurement factor by cycle, and the second learning data sets basically include process factors and measurement factor by cycle. In addition, 15 first learning data sets, 5 second learning data sets, and 5 third learning data sets may be input to the second machine learning subunits 210_2. Here, the third learning data sets may basically include formation factors and measurement factor by cycle.

The plurality of machine learning subunits 210_1, 210_2, . . . , 210_n−1, and 210_n may be configured in the same manner, and may process machine learning of learning data in a pipelined manner. The machine learning unit 210 will now be representatively described with regard to a configuration of the first machine learning subunit 210_1.

The first machine learning subunit 210_1 may classify sub learning data received from the learning data input unit 110 into learning data and valid data. Here, the learning data is data that is actually learned by the first machine learning subunit 210_1, and the valid data is data that is to be tested based on the learning data so as to confirm whether the learning result is valid or not. A ratio of the number of learning data to the number of valid data may be preset or randomly set. The ratio of the number of learning data to the number of valid data may be a preset ratio of, for example, 8:2 or 7:3, or may be set according to the quantity or quality of each data.

The first machine learning subunit 210_1 individually learns the learning data divided from the sub learning data using hidden Markov models (HMM) and assigns weights to the respective factors.

As described above, one piece of learning data may include a set of one of design factors, process factors, or formation factors, and a measurement factor by cycle. For the sake of convenience of explanation, the following description will be made on the assumption that one piece of learning data includes design factor and measurement factor by cycle.

The correlation between the design factor and measurement factor by cycle (that is, the lifetime of cell) can be calculated using the HHM, and can be expressed by a prediction function. In addition, the effect of the design factor on the lifetime of cell can be calculated by the HHM assigning weights to the design factors.

The first machine learning subunit 210_1 may obtain the prediction function having the design factors and weights as parameters based on the HHM, and may test validity of the learning result based on the HHM using the valid data.

Like the learning data, the valid data may also include one of design factors, process factors, or formation factors, and measurement factor by cycle. For example, the valid data may include a design factor as an input and measurement factor by cycle as a result for the input. Therefore, it is possible to confirm whether the learning result based on the learning data is valid or not using the valid data.

For example, it is assumed that there are three learning data of {X1, Y1}, {X2, Y2}, and {X3, Y3} and one valid data of {X', Y'}. Here, X1, X2, and X3 represent values of design factors, process factors, or formation factors, and Y1, Y2, and Y3 represent measurement factor by cycle values for X1, X2, X3, that is, cell capacity values, respectively. In addition, it is assumed that the learning result includes weights of {W1, W2, W3} for {X1, X2, X3}.

First, a value that is the most approximate to X' of valid data is searched among the learning data {X1, X2, X3}. There may be numerous methods for searching for the approximate value. However, in the present example embodiment, a least mean square method defined in the expression (1) may be used to search for the approximate value:

$$\min \sum_{k=1}^{3} (X_k - X')^2 \quad (1)$$

After the process shown in the expression (1), for example, when it is confirmed that X2 is the most approximate value to X', it is possible to determine using a weight W2 for X2 whether the learning result of X2 is valid or not. That is to say, the weight W2 for X2 and X' is input to the corresponding prediction function and the result values are compared with Y', thereby confirming the reliability of learning result of X2. Here, Y' may be a cell capacity value for the factor of X' factor, and the X' value is a predetermined value. As described above, the validity test is a process for determining how accurate values for new input values similar to the learning data are output from the prediction function.

Meanwhile, the Y' value may be compared with a result value obtained from the prediction function input the W2 and the X'. If a difference between the compared values is greater than a reference value (that is, if an error is greater than a reference value), the learning process of X2 is repeatedly performed to search for weights. If the difference is smaller than the reference value (that is, if the error is smaller than the reference value), data included in the valid data are classified as new learning data and the learning process is performed, thereby updating parameters of the prediction function, that is, learning data and weights.

The other machine learning subunits 210_2, . . . , 210_n−1, and 210_n, except for the first machine learning subunit 210_1, learn given learning data in the same manner as described above and may assign weights W2, . . . , Wn−1, Wn for the respective factors.

If the learning of the machine learning unit 210 is completed, prediction functions $F1(x), F2(x), \ldots, Fn-1(x)$, and $Fn(x)$ are determined, and the learning results may be stored in a separate storage medium (not shown). The learning results may be a set of weights, which may be represented by a predetermined matrix. For example, the set of weights is represented by a matrix M×N, as given below by the expression (2):

$$\begin{Bmatrix} W_{11} & W_{12} & \ldots & W_{1n-1} & W_{1n} \\ W_{21} & W_{22} & \ldots & W_{2n-1} & W_{2n} \\ & & \vdots & & \\ W_{m1} & W_{m2} & \ldots & W_{mn-1} & W_{mn} \end{Bmatrix} \quad (2)$$

In addition, a factor matrix corresponding to the weight matrix given by the expression (2) may be given below by the expression (3):

$$\begin{Bmatrix} X_{11} & X_{12} & \ldots & X_{1n-1} & X_{1n} \\ X_{21} & X_{22} & \ldots & X_{2n-1} & X_{2n} \\ & & \vdots & & \\ X_{m1} & X_{m2} & \ldots & X_{mn-1} & X_{mn} \end{Bmatrix} \quad (3)$$

Referring to the expressions (2) and (3), it is confirmed by machine learning that weights corresponding to the respective factors may exist. For example, a weight corresponding to a factor X22 is W22, and a weight corresponding to a factor Xmn−1 is Wmn−1.

Meanwhile, as an example of the prediction function (F(x)), a sigmoid function may be used, which may be defined by the expression (4):

$$F(x) = \frac{1}{1+e^{-Y}} \quad (4)$$

wherein Y denotes a total of the products of factor values and weights, which is defined by the following expression (5):

$$Y = \sum_{k=1, i=1}^{m,n} X_{ki} \cdot W_{ki} \quad (5)$$

Therefore, the machine learning unit 210 assigns weights indicating how much cell capacity change by cycle is affected by the design factors, the process factors, and the formation factors to then perform an operation on the prediction function defined in the expression (4). Here, the prediction function may be a correlation between the design factor, the process factor, or the formation factor and the capacity change by cycle, and may have various output values according to the factor and weight values.

In the present example embodiment, hidden Markov models (HMM) are illustrated as a module for performing machine learning (to be referred to as a learning module, hereinafter), although the learning module may include, e.g., genetic programming (GP), Gaussian mixture (GM), and neural network (NN) modules. In the present example embodiment, the learning modules may be used by being connected to each other in parallel. In another implementation, a prediction function value output from one module value may be used as an input value of the other module. The present example embodiment does not limit the machine learning module to those listed herein, and all modules implementing other learning methods for lifetime measurement may also be used.

In addition, the learning module may generate prediction results individually or hierarchically after the learning is completed. However, since it is generally difficult for one learning module to output good prediction results for all inputs, a final prediction result is obtained by referring to results from various learning modules. For example, weights obtained from the respective learning modules may be averaged. In another implementation, the most efficient learning module may be determined through validity tests performed after the learning is completed and a weight obtained from the most efficient module may be used.

Lifetime Prediction Unit

The lifetime prediction unit 220 may predict a lifetime by cycle for a target cell from the factors received from the target data input unit 120 using the prediction functions F1(x), F2(x), . . . , Fn−1(x), and Fn(x) and weights W1, W2, . . . , Wn−1, and Wn, obtained by the machine learning unit 210.

Figure 3:
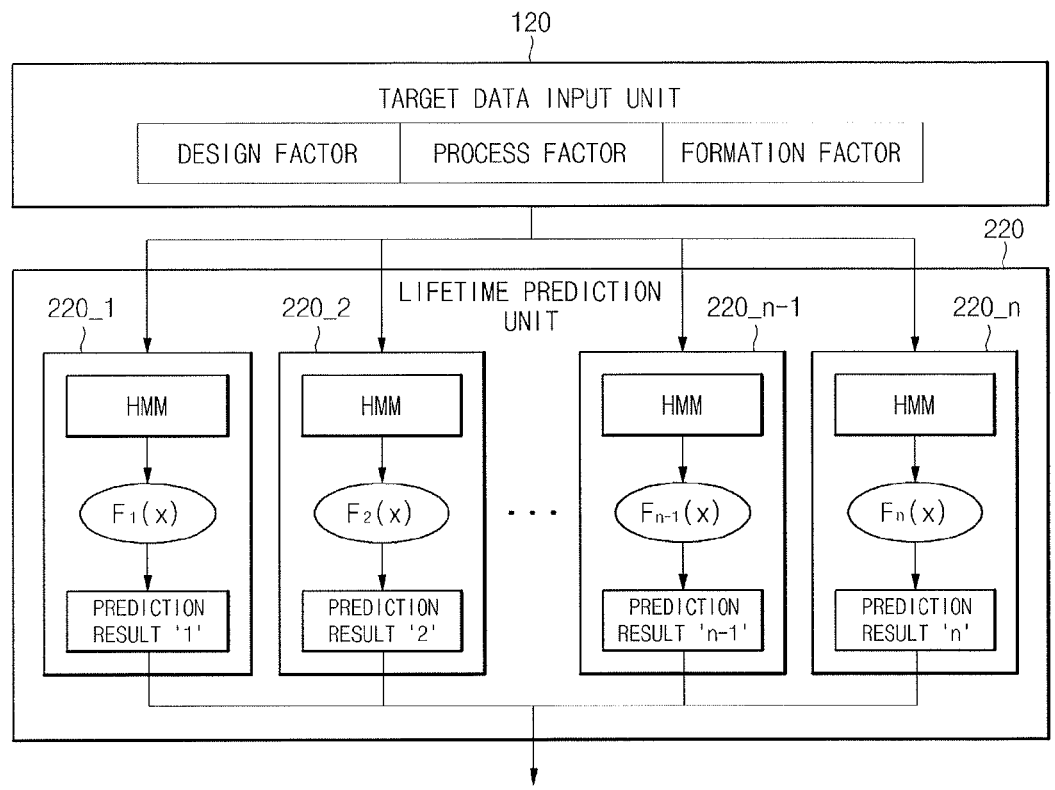
FIG. 3 illustrates a block diagram of details of a configuration of a lifetime prediction unit shown in FIG. 1.

FIG. 3 illustrates a block diagram of details of a configuration of a lifetime prediction unit shown in FIG. 1.

Referring to FIG. 3, the lifetime prediction unit 220 may include a plurality of lifetime prediction subunits 220_1, 220_2, . . . , 220_n−1, and 220_n. The respective factors may be input to the plurality of lifetime prediction subunits 220_1, 220_2, . . . , 220_n−1, and 220_n, irrespective of factor groups defined by the target data input unit 120. For example, assuming that three design factors including a physical property value of active material, a content of electrolyte, and a content of additive are input are input as target data, the three factors may be input to three lifetime prediction subunits, respectively.

Each of the plurality of lifetime prediction subunits 220_1, 220_2, . . . , 220_n−1, and 220_n searches for a learning factor closest to a target factor value among learning factor values stored in a separate storage medium (not shown) using hidden Markov models (HMM). For example, assuming that the learning factors stored in a separate storage medium (not shown) are '{X1, X2, X3, . . . , Xn−1, Xn}' and the target factor received from the target data input unit 120 is Xi, a least mean square method defined in the expression (6) may be used to search for the learning factor having the minimum difference between each of the learning factors '{X1, X2, X3, . . . , Xn−1, Xn}' and the target factor Xi:

$$\min \sum_{k=1}^{n} (X_k - X_i)^2 \quad (6)$$

Here, if it is confirmed that the X2 value among the learning factors is closest to or equal to the Xi value, the weight and prediction function corresponding to the learning factor X2 are fetched and the corresponding weight and the target factor value Xi are substituted to the corresponding prediction function, thereby obtaining lifetime prediction results. In the same manner as described above, the lifetime prediction results may be obtained using various target factors as input values and the final prediction result may then be obtained. Here, the final prediction result is lifetime data for a capacity change depending on the number of cycles, which may be indicated by the lifetime indication unit 300.

The technique related with the machine learning method according to the present embodiment may be a general technique. For example, a method for obtaining a weight matrix by learning correlation between input data and output data and a prediction method are disclosed in "Pattern Recognition and Machine Learning" (Hyeyoung Park & Kwanyong Lee, Ehan Publishing Company, Mar. 5, 2011) or "Introduction to Machine Learning" (Alpaydin & Ethem, MIT Press, Feb. 1, 2010).

Lifetime Indication Unit

The lifetime indication unit 300 may receive lifetime data from the lifetime prediction unit 220 and may indicate the received lifetime data on a display by graphical representation.

EXAMPLES

Hereinafter, comparison examples of battery lifetime prediction results according to embodiments and actual measurement results will be described with reference to the accompanying drawings.

Figure 4:
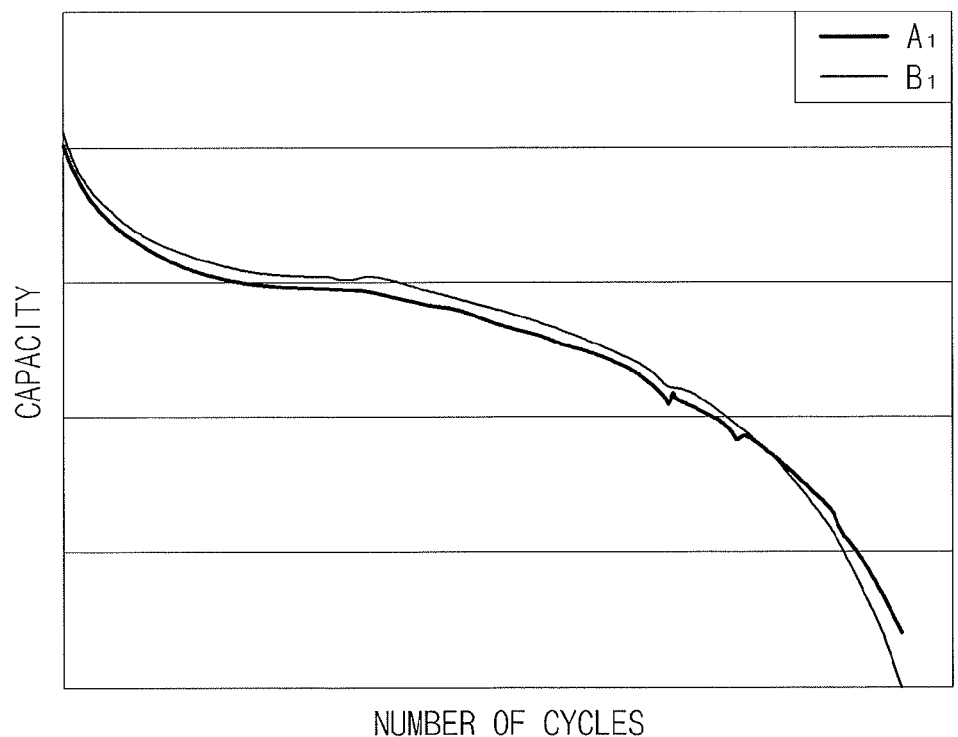
FIGS. 4 to 6 illustrate comparative graphs of battery lifetime prediction results according to embodiments and actual measurement results.

FIG. 4 illustrates a graph of a comparison result of a battery lifetime prediction result 'A1'' according to an example embodiment with an actual measurement result 'B1' for a prediction target cell.

In detail, the graph is FIG. 4 shows a comparison result of a battery lifetime prediction result 'A1' according to an example embodiment, in which design factors (specifically, physical property values of the active material, physical property values of the separator, and a content of the additive) and formation factors were input as target data, with an actual measurement result 'B1' of capacity changes by cycle for the prediction target cell. Here, the same battery cell was used as targets for the battery lifetime prediction result 'A1' and the actual measurement result 'B1'.

As shown in FIG. 4, it is confirmed that the battery lifetime prediction result 'A1', which was obtained using only some of design factors as target data, was substantially the same as the actual measurement result 'B1'.

Figure 5:
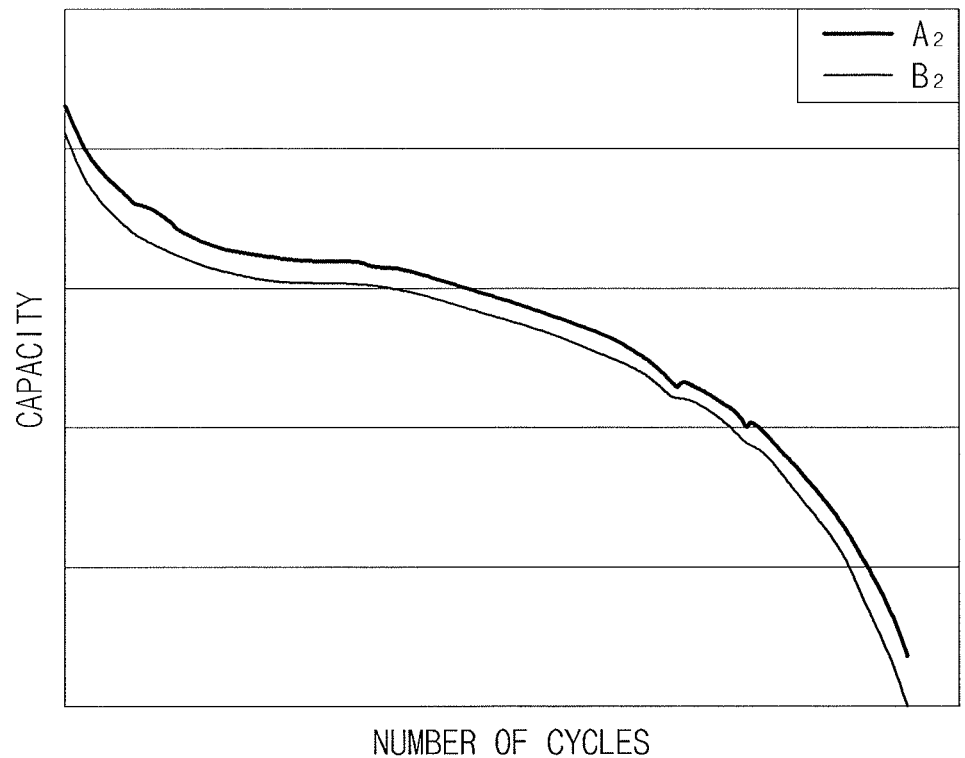

FIG. 5 is a graph illustrating a comparison result of a battery lifetime prediction result 'A2' according to an embodiment, in which design factors (specifically, physical property values of the active material and physical property values of the separator) and formation factors were input as target data, with an actual measurement result 'B2' of capacity changes by cycle for a prediction target cell. Here, the same battery cell was used as targets for the battery lifetime prediction result 'A2' and the actual measurement result 'B2'.

As shown in FIG. 5, it is confirmed that the battery lifetime prediction result 'A2', obtained without using the content of additive (as compared to the battery lifetime prediction result 'A1' shown in FIG. 4), was substantially the same as the actual measurement result 'B2'.

Figure 6:
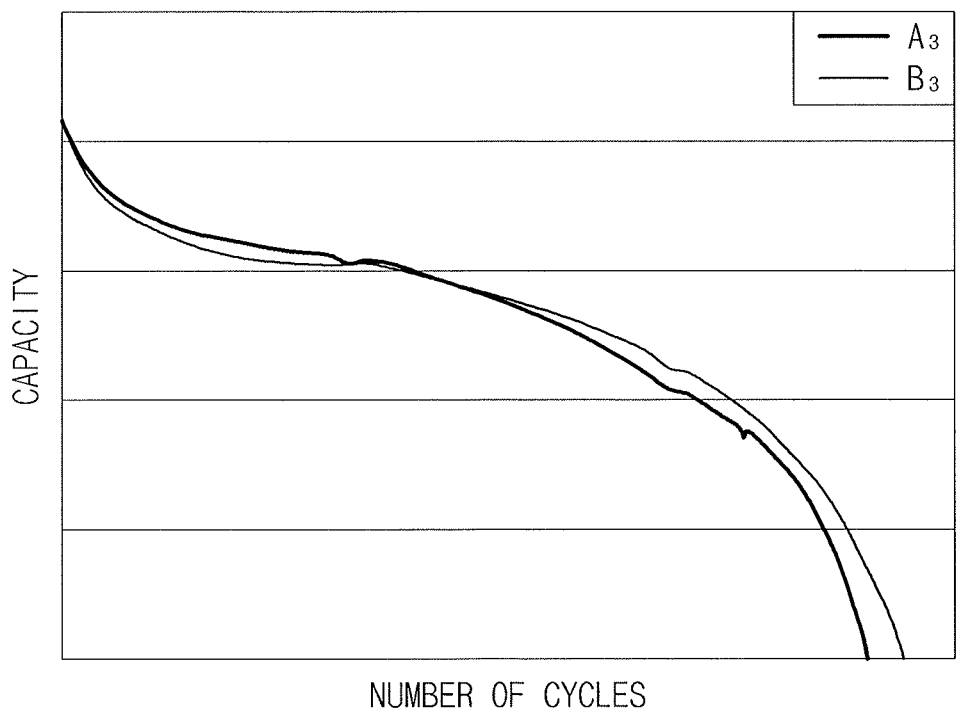

FIG. 6 is a graph illustrating a comparison result of a battery lifetime prediction result 'A3' according to an embodiment, in which design factors (specifically, physical property values of the active material and the content of additive) were input as target data, with an actual measurement result 'B3' of capacity changes by cycle for a prediction target cell. Here, the same battery cell was used as targets for the battery lifetime prediction result 'A3' and the actual measurement result 'B3'.

As shown in FIG. 6, it is confirmed that the battery lifetime prediction result 'A3', obtained without using physical property values of separator and formation factors as target data (as compared to the battery lifetime prediction result 'A1' shown in FIG. 4), was substantially the same as the actual measurement result 'B3'.

Comparative Example

Figure 7:
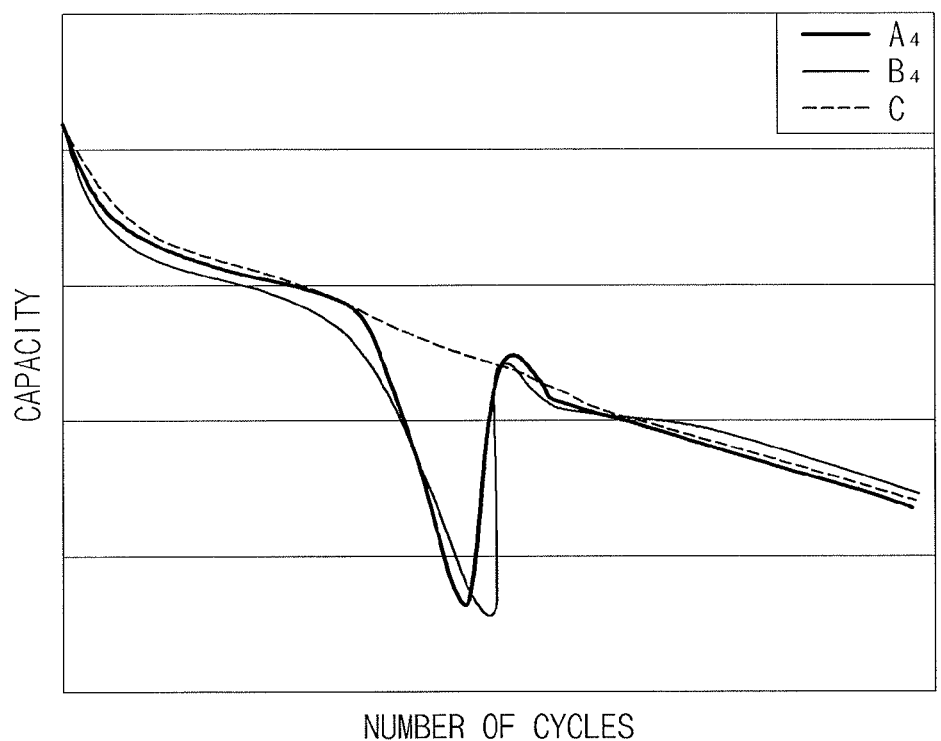
FIG. 7 illustrates a comparative graph of a battery lifetime prediction result according to an embodiment, an actual measurement result, and a general prediction result.

FIG. 7 illustrates a graph of a battery lifetime prediction result 'A4' according to an embodiment, an actual measurement result 'B4', and a general comparative prediction result 'C'. More particularly, the general comparative prediction result 'C' shown in FIG. 7 shows a lifetime prediction result obtained by linearly connecting an initial lifetime prediction result and a long-term lifetime prediction result, which were obtained by inputting battery capacity values measured in initial cycles (for example, 1 to 10 cycles) and a long-term cycle (for example, 300 cycle) as target data.

As shown in FIG. 7, according to the general comparative result 'C', only lifetime data in the initial and final cycles are predicted; the general comparative result shows difficulties in predicting abnormal lifetime data in middle-stage cycles. Here, the abnormal lifetime data indicates that the battery capacity steeply drops and then steeply rises in the middle stage of cycles, as shown in FIG. 7. The abnormal lifetime data may be generated when, e.g., the electrolyte in the battery is disposed to lean to one side of the battery, when an active material is not evenly distributed throughout an electrode plate, or when adhesion between the separator and the electrode plate is poor. On the other hand, as shown in FIG. 7, the battery lifetime prediction result 'A4' was substantially the same as the actual measurement result 'B4'. In detail, the actual measurement result 'B4' shown in FIG. 7 shows abnormal lifetime data occurring in a predetermined period, and said abnormal lifetime data can be predicted as the battery lifetime prediction result 'A4' according to an embodiment.

By way of summation and review, a system using an artificial neural network to predict a lifetime of a battery may use initial characteristic data and long-term characteristic data of the battery as learning data. Here, the initial characteristic data may include charge characteristic change data of a battery cell, measured during activation of the battery cell, charge and/or discharge characteristic change data of battery cell, measured during initial cycles (for example, approximately 1 to 10 cycles), thickness change data, open voltage change data, and so on. In addition, the long-term characteristic data may include charge and/or discharge characteristic change data of battery cell, measured during a preset long-term cycle (for example, approximately 300 cycle), thickness change data, open voltage change data and so on.

In a general lifetime prediction system using the learning data as input values, input values for a battery cell intended for lifetime measurement should be measured, requiring additional time for cell fabrication and characteristic evaluation, thereby causing a delay in development schedule. In addition, if there is a large deviation between battery cells fabricated for prediction, reliability of the initial characteristic data may be lowered. Thus, the general lifetime prediction system may not ensure high reliability because it employs simple numerical analysis without consideration taken into physical and/or chemical characteristics.

As described above, embodiments may provide a battery lifetime prediction system that has improved reliability while predicting lifetime tendency depending on various characteristic factors of a battery cell within a short time before evaluating the lifetime of a manufactured battery cell. According to an embodiment, a battery cell lifetime depending on various characteristic factors of a battery cell may be predicted before evaluating the lifetime of a manufactured battery cell, thereby determining design errors before manufacturing battery cells. Accordingly, the time and material cost required for manufacturing a battery cell may be minimized and a time required for lifetime evaluation may be shortened.

In addition, the battery lifetime prediction system according to an embodiment may performs lifetime prediction based on previously accumulated design characteristic data and capacity data, thereby reducing a time required for the lifetime prediction, compared to the conventional battery lifetime prediction system. In addition, learning may be made using design factors including physical and/or chemical characteristics as input values. Thus, reliability for lifetime prediction may be ensured.

As described above, the overall lifetime tendency may be easily predicted using input values of design factors with physical and/or chemical characteristics taken into consideration as target data. The overall lifetime tendency may be easily predicted. Thus, the abnormal lifetime data may also be predicted, thereby identifying and solving a problem with a battery cell before manufacturing the battery cell.

As described above, the lifetime prediction unit according to an embodiment may predict a lifetime by cycle for a target cell even if the measurement factor-by-cycle as target data is not input to the target data input unit.

It will be understood by those of skill in the art that various changes in form and details may be made without departing from the spirit and scope of the present invention as set forth in the following claims. For example, an embodiment may be implemented as an article of manufacture including a computer readable recording medium, the recording medium having recorded thereon a program. for executing a method. For example, the program may be a program for executing a method of predicting a lifetime of a target battery cell, the method including establishing a prediction function, establishing the prediction function including receiving a first factor of a previously-manufactured learning battery cell and receiving a second factor of the learning battery cell, the first factor being determined from an historical measurement of a characteristic of the learning battery cell, the second factor corresponding to the manufacture of the learning battery cell and being selected from the group of a design factor of the learning battery cell, a process factor of the learning battery cell, and a formation factor of the learning battery cell, and correlating the first factor of the learning battery cell with the second factor of the learning battery cell, receiving a second factor of the target battery cell as an input, the second factor of the target battery cell being selected from the group of a design factor of the target battery cell, a process factor of the target battery cell, and a formation factor of the target battery cell, applying the prediction function to the second factor of the target battery cell, and, based on the application of the prediction function to the second factor of the target battery cell, outputting a predicted characteristic of the target battery cell.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

What is claimed is:

1. A system for predicting a lifetime of a battery cell, the system comprising:
    a learning data input unit, the learning data input unit being configured to receive at least one learning measurement factor and at least one learning factor, the learning measurement factor and the learning factor associated with a learning battery cell that was previously manufactured;
    a target data input unit, the target data input unit being configured to receive at least one target factor, the target factor associated with a target battery cell;
    a machine learning unit, the machine learning unit being coupled to the learning data input unit, the machine learning unit to generate a prediction function by assigning weights to respective ones of the learning factors input to the learning data input unit based on the learning measurement factor and the learning factor from the learning data input unit; and
    a lifetime prediction unit, the lifetime prediction unit being coupled to the target data input unit and the machine learning unit, the lifetime prediction unit to predict a lifetime of the target battery by using the target factor in association with the target battery and the prediction function generated by the machine learning unit before manufacturing the target battery cell, wherein:
    the learning data input unit is configured to receive at least one learning process factor, the learning process factor being indicative of a process parameter used during manufacture of the learning battery cell.

2. The system as claimed in claim 1, wherein the learning measurement factor is obtained by actual measurement of a characteristic value of the learning battery cell.

3. The system as claimed in claim 2, wherein the learning measurement factor is selected from the group of a change in a capacity of the learning battery cell depending on a number of cycles and a change in a thickness of the learning battery cell depending on a number of cycles.

4. The system as claimed in claim 3, wherein one cycle consists of one charge, one discharge, and one idle time, the idle time being a time between the charge and the discharge or a time between the charge and/or discharge and a next charge and/or discharge.

5. The system as claimed in claim 1, wherein the at least one learning factor is selected from the group of a learning design factor, the learning process factor, and a learning formation factor.

6. The system as claimed in claim 5, wherein the learning data input unit is configured to receive at least one learning design factor, the learning design factor being indicative of a design parameter of the learning battery cell.

7. The system as claimed in claim 6, wherein the learning design factor is selected from the group of a capacity of the learning battery cell, an energy density of the learning battery cell, a thickness of the learning battery cell, a length of the learning battery cell, a width of the learning battery cell, a current density of the learning battery cell, a slurry concentration of the learning battery cell, an electrode thickness of the learning battery cell, a loading level of the learning battery cell, a form factor of the learning battery cell, a width of a separator of the learning battery cell, a thickness of the separator of the learning battery cell, a kind of the separator of the learning battery cell, a presence or absence of separator coating on the separator of the learning battery cell, a number of windings of an electrode plate of the learning battery cell, a number of windings of the separator of the learning battery cell, an adhesion between an electrode plate and the separator of the learning battery cell, a type of electrolyte used, an electrolyte composition of the learning battery cell, an electrolyte amount of the learning battery cell, a kind of additive of the learning battery cell, an amount of additive of the learning battery cell, a discharge rate (C-rate) of the learning battery cell, a porosity of the learning battery cell, a thickness of a current collector of the learning battery cell, a strength of the current collector of the learning battery cell, a thickness of a pouch of the learning battery cell, a physical property value of an active material of the learning battery cell, and a physical property value of a binder material of the learning battery cell.

8. The system as claimed in claim 6, wherein the learning design factor is known prior to manufacture of the learning battery cell.

9. The system as claimed in claim 1, wherein the learning process factor is selected from the group of a winding tension of a component of the learning battery cell, a degassing and folding condition of the learning battery cell, and a tab welding method of the learning battery cell, the component being a separator or an electrode plate.

10. The system as claimed in claim 5, wherein the learning data input unit is configured to receive at least one learning formation factor, the learning formation factor being indicative of a formation parameter of the learning battery cell following the assembly of the learning battery cell.

11. The system as claimed in claim 10, wherein the learning formation factor is selected from the group of a temperature, a time, a charge and/or discharge current, a voltage, a cutoff condition, and a pressure associated with one or more selected from the group of aging, charging and/or discharging, and degassing and resealing the learning battery cell.

12. The system as claimed in claim 1, wherein the at least one target factor is selected from the group of a target design factor, a target process factor, and a target formation factor.

13. The system as claimed in claim 1, wherein the lifetime prediction unit is configured to predict a characteristic selected from the group of a change in a capacity of the target battery cell depending on a number of cycles and a change in a thickness of the target battery cell depending on a number of cycles.

14. The system as claimed in claim 1, wherein:
the machine learning unit includes a number of machine learning subunits, and
the lifetime prediction unit includes a number of lifetime prediction subunits corresponding to the number of machine learning subunits.

15. The system as claimed in claim 14, wherein each machine learning subunit assigns a weight based on a corresponding learning factor, the learning factor being selected from the group of a learning design factor, a learning process factor, and a learning formation factor.

16. The system as claimed in claim 15, wherein each lifetime prediction subunit performs a prediction function using a weight assigned by a corresponding machine learning subunit.

17. The system as claimed in claim 1, further comprising a lifetime indication unit, the lifetime indication unit being coupled to the lifetime prediction unit, the lifetime indication unit indicating a predicted lifetime of the target battery cell based on the one or more predicted characteristics.

18. A method of predicting a lifetime of a target battery cell, the method comprising:
establishing a prediction function, establishing the prediction function including:
receiving a first factor of a previously-manufactured learning battery cell and receiving a second factor of the learning battery cell, the first factor being determined from an historical measurement of a characteristic of the learning battery cell, the second factor corresponding to the manufacture of the learning battery cell and being selected from the group of a design factor of the learning battery cell, a process factor of the learning battery cell, and a formation factor of the learning battery cell, and
correlating the first factor of the learning battery cell with the second factor of the learning battery cell;
receiving a second factor of the target battery cell as an input, the second factor of the target battery cell including a process factor of the target battery cell, the process factor being indicative of a process parameter used during manufacture of the learning battery cell;
applying the prediction function to the second factor of the target battery cell; and
based on the application of the prediction function to the second factor of the target battery cell, outputting a predicted characteristic of the target battery cell before manufacturing the target battery.

19. The method as claimed in claim 18, wherein the second factor of the target battery cell is selected from the group of a design factor of the target battery cell, the process factor of the target battery cell, and a formation factor of the target battery cell.

* * * * *